(12) United States Patent
Solomon et al.

(10) Patent No.: US 6,176,925 B1
(45) Date of Patent: Jan. 23, 2001

(54) DETACHED AND INVERTED EPITAXIAL REGROWTH & METHODS

(75) Inventors: Glenn S. Solomon, Redwood City; David J. Miller, Belmont; Tetsuzo Ueda, Menlo Park, all of CA (US)

(73) Assignees: CBL Technologies, Inc., Redwood City, CA (US); Matsushita Electronics Corporation, Osaka (JP)

( * ) Notice: Under 35 U.S.C. 154(b), the term of this patent shall be extended for 0 days.

(21) Appl. No.: 09/307,154

(22) Filed: May 7, 1999

(51) Int. Cl.$^7$ .................................................. C30B 25/02
(52) U.S. Cl. ............................ 117/89; 117/95; 117/101; 117/102; 117/915; 117/952
(58) Field of Search .............................. 117/915, 89, 95, 117/101, 102, 952

(56) References Cited

U.S. PATENT DOCUMENTS

| | | | |
|---|---|---|---|
| 5,889,338 | * 11/1999 | De Boer et al. | 117/84 |
| 6,030,886 | * 2/2000 | Yuri et al. | 117/952 |
| 6,045,626 | * 4/2000 | Yano et al. | 117/952 |
| 6,096,130 | * 8/2000 | Kimura et al. | 117/101 |

FOREIGN PATENT DOCUMENTS

WO9814986 * 4/1998 (WO) .

OTHER PUBLICATIONS

Woong et al, "Damage–Free Separation of GaN Thin Films from Substrates" Applied Physics Letters, vol. 72(5) pp. 599–601, 1998.*

* cited by examiner

Primary Examiner—Robert Kunemund
(74) Attorney, Agent, or Firm—Lumen Intellectual Property Services

(57) ABSTRACT

An n-doped, high quality gallium nitride substrate suitable for further device or epitaxial processing, and method for making the same. The nitride substrate is produced by epitaxial deposition of first metal nitride layer on a non-native substrate followed by a second deposition of metal nitride. During the second deposition of metal nitride, a liquid metal layer is formed at the interface of the non-native substrate and the metal nitride layer form. The formed metal nitride layer may be detached from the non-native substrate to provide an metal nitride substrate with a high quality inverse surface. A epitaxial metal nitride layer may be deposited on the inverse surface of metal nitride substrate. The metal nitride substrate and the epitaxial metal nitride layer thereon may be deposited using the same hydride vapor-phase epitaxy system.

40 Claims, 5 Drawing Sheets

Fig. 1A
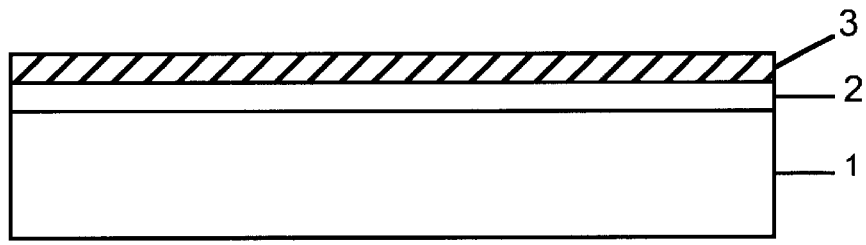
Fig. 1B
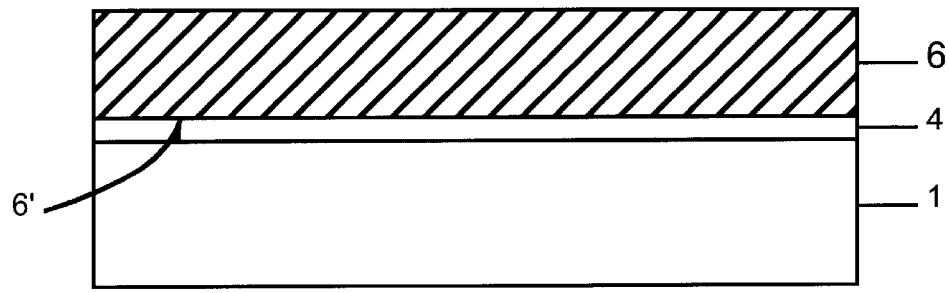
Fig. 1C
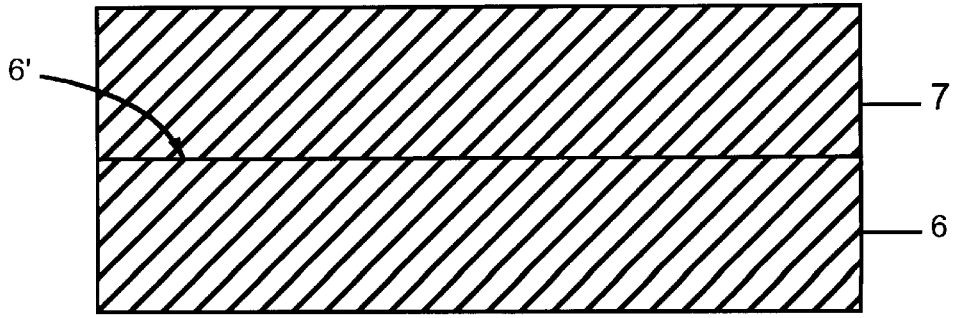
Fig. 1D
*FIG. 1*

DETACHED AND INVERTED EPITAXIAL REGROWTH & METHODS

BACKGROUND OF THE INVENTION

1. Field of the Invention

The present invention relates to native metal nitride substrates for nitride deposition. The invention also relates to the growth of a nitride epitaxial layer on a non-native substrate. The invention further relates to GaN substrates having heavy n-type doping. The invention still further relates to a method of detaching a high quality nitride epitaxial layer from a silicon substrate.

2. Background of the Related Art

Gallium nitride (GaN) is emerging as an important material for high technology applications. For example, GaN is currently used in the manufacture of blue light emitting diodes, semiconductor lasers, and other opto-electronic devices. However, it is currently impossible to fabricate bulk GaN crystals of usable size as substrates in semiconductor manufacturing using prior art methods and materials. Therefore, GaN films, heretofore, have been made by deposition on a non-native substrate material, typically sapphire ($Al_2O_3$). Due to the large lattice mismatch and thermal mismatch which exists between the $Al_2O_3$ substrate and the GaN layer, the resulting structure has large dislocation densities, thereby limiting the performance of devices fabricated from these films.

Furthermore, sapphire substrates have many disadvantages from the point of view of electronic device manufacturing. For example, sapphire substrates are electrically insulating, so that all electrical contacts must be made from the epitaxial side, thereby increasing the difficulty and cost of device fabrication. In addition, sapphire is a poor conductor of heat, which can limit the power of devices which incorporate this material. Also, sapphire is mechanically very hard, and is thus difficult to remove from the epitaxial film. Finally, sapphire is an expensive material, which leads to increased cost of the device. For all these reasons, there is a need in the semiconductor industry for a GaN native substrate.

Substrates other than sapphire have been investigated in the prior art for GaN epitaxial deposition. However, each of these substrates suffer from their own drawbacks. For example, silicon (Si), having low cost and being widely used in the semiconductor industry, would have appeared to be an attractive material for use as a non-native GaN substrate. However, it is impossible to grow an epitaxial film of GaN directly on a silicon substrate using growth techniques of the prior art. Thus, a thin but resistant layer of amorphous silicon nitride ($Si_3N_4$) forms preferentially on the silicon surface, during the growth process. This silicon nitride layer interferes with the ability of the underlying Si crystal to induce order in the epitaxial layer. The result is that the GaN nucleating on the nitridized surface is polycrystalline or amorphous, unlike the single-crystal layers grown on sapphire. Also, there is a thermal mismatch between the Si and the GaN layers; i.e., they have different coefficients of thermal expansion (CTE), which induces strain and cracking in the epitaxial layer upon cooling. In order for GaN layers grown on Si to be technologically useful, these problems must be overcome.

Other prior art methods of overcoming the problems associated with the use of sapphire substrates for GaN growth have involved removal of the substrate from a thick epitaxial GaN layer. For example, according to one prior art technique, the growth substrate can be completely etched away, or "sacrificed," at the growth temperature, either before or after the GaN deposition is complete. This technique, however, has several disadvantages. For example, the additional etching step adds cost and complexity to the process: controlling the two processes and ensuring that they remain properly isolated from one another is difficult. In addition, it can be difficult to retain the GaN layer in place once the sacrificial substrate is etched away. Alternative techniques have involved removing the unwanted substrate in a separate process after growth of the epitaxial layer. An example is the wafer bonding technique, which allows the substrate to be removed after the sample has been taken out of the growth system by mounting the substrate-epitaxy structure upside down and subsequently removing the substrate. This method does not resolve any thermal mismatch problem in the original substrate-epitaxial system, and again requires a separate substrate removal step.

The present invention resolves problems associated with producing high-quality substrates of a material (e.g., GaN) which cannot be fabricated by traditional bulk-crystal techniques, and which suffers from degradation of quality when deposited on an unsuitable substrate. Prior art techniques generally produce crystals of low quality on technologically inconvenient substrates, or involve separate processes to grow the epitaxial layer and remove the substrate. The present invention provides an integrated technique where growth and detachment of a GaN substrate may be achieved in the same reactor system. The result is a high-quality, single-crystal GaN substrate, heavily n-doped with silicon. This substrate is more useful for subsequent deposition of higher-quality epitaxial layers than are achievable using a non-native substrate. The material formed according to the invention is useful for applications in a wide array of electronic and opto-electronic devices, such as light-emitting diodes and semiconductor lasers.

SUMMARY OF THE INVENTION

According to one aspect of the invention, there is provided a high quality substrate of GaN, or related compounds, or alloys thereof, as well as an efficient and cost-effective method of making the same. According to the invention, an epitaxial gallium nitride or similar group III nitride semiconductor layer is grown on a silicon substrate. The epitaxial nitride layer is then detached from the silicon substrate to provide a detached nitride layer. The detached nitride layer may then be inverted to reveal a high-quality GaN surface, free from any underlying non-native substrate and that may be used as a native metal nitride substrate for subsequent epitaxial metal nitride layer growth and deposition. Subsequent growth of GaN on the inverse surface of the detached layer results in a single-crystal, high-quality native GaN structure which may be grown to any desired thickness.

The invention overcomes the difficulties associated with the prior art use of a non-native substrate, such as sapphire, for GaN growth. Epitaxial materials grown on native substrates of the instant invention have fewer defects than those grown on sapphire, and they are not generally amorphous or polycrystalline, as is GaN grown directly on Si. Epitaxial material grown according to the invention is therefore better suited for processing into electronic or opto-electronic devices. As an additional advantage, the Si substrates used according to the invention are significantly less expensive, and more readily available, than sapphire substrates. Further, larger diameter silicon wafers are available (e.g. 8 inches and greater), thus allowing for the production of larger GaN substrates made in accordance with the present invention.

According to another aspect of the invention, a technique is provided for removing GaN or related epitaxial layers (such as AlN) from Si substrates in a straightforward and inexpensive manner. This technique will now be briefly described with reference to GaN, as follows. GaN is readily grown by hydride vapor-phase epitaxy (HVPE). A Si sample having a first epitaxial layer of GaN is introduced into a HVPE system, and additional GaN is deposited as a second GaN layer. During deposition of the second GaN layer, a layer of liquid gallium is formed at the substrate interface and the GaN material from the first nitride layer is incorporated into the second nitride layer to form a composite nitride layer. The composite GaN layer then "floats" above the remaining Si substrate on a thin film of liquid gallium (Ga). Because the composite GaN layer is held in place only by the viscous attachment of the liquid Ga, it is not subject to strain due to thermal mismatch. The absence of strain in the epitaxial second GaN layer prevents it from cracking as it cools from the growth temperature. After growth, the composite GaN layer formed by the technique just described is easily removed from the non-native (Si) substrate, and may be easily inverted to reveal a high-quality inverse surface suitable for subsequent depositions of epitaxial metal nitrides.

The technique of the invention overcomes the problems of prior art techniques associated with the formation of the nitridized Si layer below the GaN epitaxial layer. Furthermore, the technique of the invention is preferable to prior art techniques that involve sacrifice of the substrate, either at the growth temperature or in a separate process after growth, because the GaN layer is removed from the substrate naturally during the growth process. This means that separate control and isolation of the growth and removal processes is not necessary.

In another aspect of the invention, a method is provided for growing GaN substrates with heavy n-type doping. Incorporation of Si into GaN substrates is often desirable, because the controlled presence of this impurity provides free electrons to GaN, making the semiconductor highly conductive. Such conductive substrates allow for simplified and efficient fabrication of electronic and opto-electronic devices from the n-doped material. According to prior art methods, doping of GaN substrates with Si requires a difficult process for the incorporation of the dopant into the growth process. In contrast, in the detached-substrate method described above, Si dopant automatically enters the GaN epitaxial layer as a result of diffusion from the Si substrate. Thus, the instant invention provides for heavy n-type doping of semiconductor materials with increased simplicity and reduced cost.

In view of the above, it is an object of the present invention to provide a high quality epitaxial layer and a method of making the same.

One feature of the invention is that it provides a nitride layer which is readily removed from a non-native substrate on which it was formed. Another feature of the invention is that it provides a method of detaching a nitride layer from a non-native substrate.

One advantage of the invention is that it provides a method for fabricating an epitaxial GaN layer on an inverse surface of a detached GaN film. Another advantage of the invention is that it provides an epitaxial layer formed by mechanically detaching the layer from a non-native substrate. Another advantage of the invention is that it provides a GaN epitaxial layer formed by chemically etching the interface between GaN and a silicon substrate. Another advantage of the invention is that it provides an efficient method for forming an epitaxial metal nitride layer on a silicon substrate.

These and other objects, advantages and features are accomplished by the provision of a method of forming a metal nitride substrate, including the steps of: providing a non-native substrate; depositing a first metal nitride layer on the non-native substrate; forming a liquid layer on the non-native substrate concurrently with a second deposition of metal nitride to form a composite metal nitride layer comprising material from the first nitride deposition; detaching the composite layer formed from the non-native substrate to provide a native metal nitride substrate; inverting the nitride substrate layer to present a high quality metal nitride layer surface; and forming an epitaxial metal nitride layer on the native nitride substrate.

These and other objects, advantages and features are accomplished by the provision of a high quality native substrate adapted for metal nitride epitaxial deposition, including: a composite metal nitride layer formed from a fist and second nitride layer deposition processes with the composite layer having an inverse surface, the second metal nitride deposition layer formed by HVPE, wherein the inverse surface of the composite nitride layer is formed adjacent to a liquid metal layer.

These and other objects, advantages and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

BRIEF DESCRIPTION OF THE DRAWINGS

FIGS. 1A, 1B, 1C, and 1D represent sequential stages in fabrication of a high quality metal nitride substrate, according to the invention;

DETAILED DESCRIPTION OF THE PREFERRED EMBODIMENTS

Figure 2:
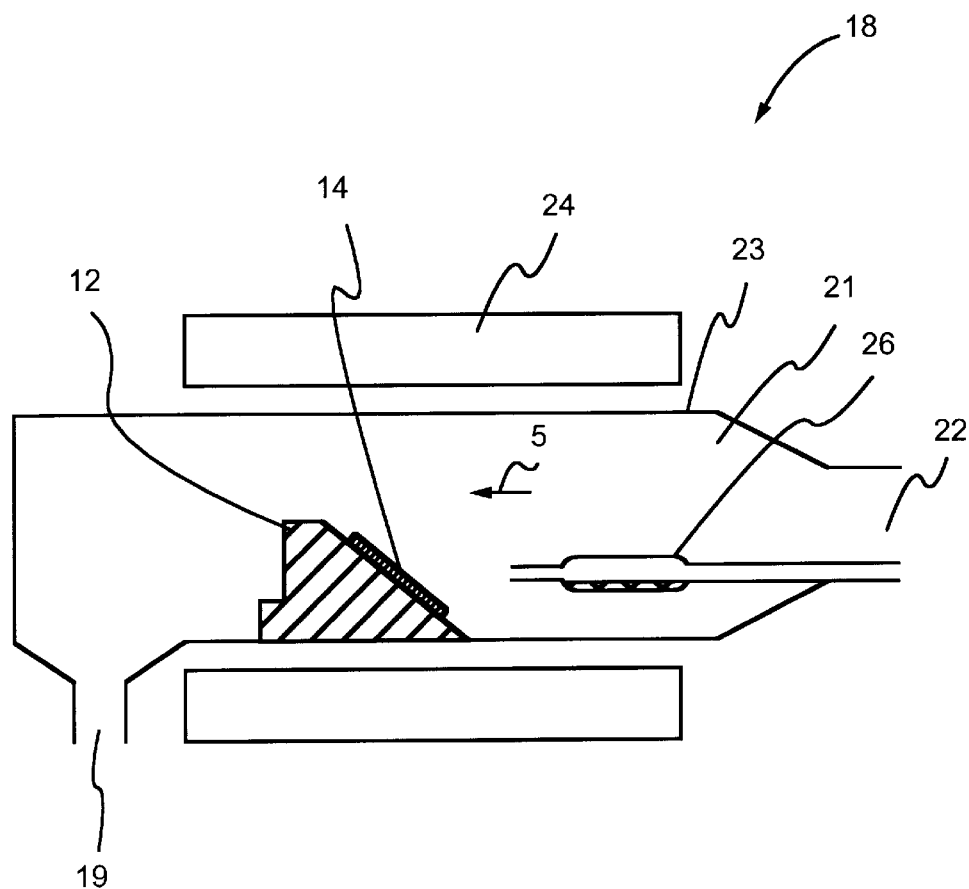
FIG. 2 schematically represents a HVPE system suitable for forming a metal nitride epitaxial layer on a silicon substrate.

For purposes of illustration, the invention will be described with particular emphasis on the HVPE growth of GaN. However, it is to be understood that the invention is also applicable to the deposition of other materials, and to deposition techniques other than HVPE.

Referring now to the drawings, FIGS. 1A, 1B, 1C, and 1D represent sequential stages in fabrication of a high quality metal nitride substrate, according to the invention. FIG. 1A represents a conventional, non-native substrate 1, well known in the art. According to the invention, substrate 1 is preferably a silicon substrate.

FIG. 1B represents a thin layer of silicon nitride ($Si_3N_4$) shown as layer 2 formed on non-native substrate 1, and a relatively thin layer 3 of a metal nitride disposed on layer 2. Layer 3 thus represents the first metal nitride layer to be deposited. The term metal nitride refers generally to a nitride of group III metals. Examples of such metal nitrides are GaN, InN, and AlN. A currently preferred metal nitride of the invention is GaN.

The first metal nitride layer 3 may be grown on substrate 1 by any suitable epitaxial growth technique, such as HVPE (FIG. 2) or metal-organic chemical vapor deposition (MOCVD). The technique of MOCVD is well known in the art. However, for the purpose of clarity MOCVD will now be briefly described with reference to the deposition of GaN. Ammonia gas and gallium containing metallo-organic compounds, e.g., trimethylgallium or triethylgallium, are introduced into a MOCVD reaction chamber. GaN is deposited on the non-native substrate as a result of the high temperature reaction between the ammonia and the gallium containing compound. Typically, using MOCVD, a layer of GaN ranging in thickness from about 10 to 100 nanometers may be deposited. Instead of GaN, related materials such as InN, or AlN, or alloys of these materials, may similarly be deposited.

It should be noted that the formation of layer 2 may occur as a result of the growth of layer 3. Also, due to the nitridized surface of layer 2, layer 3 is either amorphous or polycrystalline. By judicious choice of the initial growth conditions or composition of reactants the formation of a $Si_3N_4$ layer 2 may be avoided and the resultant nitride layer 3 tends to be crystalline.

FIG. 1C represents a liquid layer 4 formed on non-native substrate 1, and a second metal nitride layer 6 formed by deposition on liquid layer 4. According to the invention, layer 4 comprises a layer of liquid metal, e.g., liquid gallium. According to a currently preferred embodiment of the invention, layer 6 is formed by HVPE growth of GaN on the surface of the structure shown in FIG. 1B. HVPE deposition of GaN on a substrate results from the reaction between ammonia and GaCl, as will be described more fully hereinbelow with reference to FIG. 2. In a particular embodiment of the invention the liquid layer 6 that is formed is a liquid gallium layer during the deposition of a GaN layer 6. It is plausible that liquid Ga layer 4 is formed by a reaction with GaCl, formed in the reaction chamber, with the non-native silicon substrate; this reaction produces $SiCl_4$ gas. The first metal nitride layer 3 (FIG. 1B) is incorporated in the second nitride layer and the liquid gallium layer is formed concurrently during the deposition of the second nitride layer.

FIG. 2 schematically represents a HVPE system 18 suitable for depositing layers 6 (and layer 4) on substrate 1 (FIG. 1C). HVPE systems are generally well known to the skilled artisan. Briefly, system 18 includes a growth tube or reactor 21 having inlet 22, outlet 19, and a reaction assembly 26. System 18 may be contained entirely within a heat source, e.g., a furnace 24. Generally speaking, epitaxial deposition on a heated structure 14 proceeds by the vapor-phase reaction of reagent gases which are introduced into reactor 21. For example, a reagent gas, such as gallium chloride, indium chloride, or aluminum chloride, may be projected towards structure 14 via reaction assembly 26; while ammonia may be introduced into growth tube 21 through reactor inlet 22. Reagent gas, e.g. GaCl, may be formed in reaction assembly 26 by passing HCl over liquid metal (e.g., gallium) at high temperatures. Excess HCl also enters reactor 21 via assembly 26. The direction of gas flow is indicated by arrow 5. Reagent gases (e.g., GaCl, InCl, AlCl) react with ammonia within growth tube 21 to form the respective nitride, GaN, InN, or AlN, which is deposited on structure 14. According to the invention, structure 14 may represent the structure of FIG. 1B.

If surplus HCl is provided to the GaCl production chamber, the gas mixture reaching structure 14 will typically contain GaCl, HCl, a carrier gas e.g., nitrogen, and byproduct gases such as $SiCl_4$. As already described hereinabove, the reaction of the GaCl with the $NH_3$ results in a GaN layer 6. Additionally, GaCl diffuses along the interface, represented by layer 2, between the silicon substrate 1 and the first metal nitride layer 3 (FIG. 1B). The presence of HCl and GaCl facilitate the dissolution of the first metal nitride layer 3 form the non-native substrate 1. While FIG. 1B represents layers 2 and 3 as discrete layers, they may be more appropriately described as an admixture or mixture of reactants (including GaCl, GaN and HCl) and byproducts (including Ga metal, $SiCl_4$ and $H_2$). Herein, the GaCl 2 reacts with the silicon of substrate 1 and the metal nitride of layer 3 to form elemental metal (e.g., elemental gallium), as well as volatile byproducts such as silicon chloride ($SiCl_4$) and hydrogen gas. The volatile byproducts escape as vapors via outlet 19, while the elemental metal (e.g., gallium) remains as liquid layer 4, as shown in FIG. 1C, disposed between second metal nitride layer 6 and substrate 1. The process described above produces a high-quality metal nitride inverse surface 6' (FIGS, 1C and 1D) of layer 6, adjacent to liquid layer 4. Thus, a detachable GaN layer is achieved as a result of a single process.

In the case of gallium, layer 4 remains liquid at about room temperature, in which case removal of layer 6 may be performed simply by sliding epitaxial layer 6 off substrate 1. Alternatively, for example where layer 6 is too thin to allow layer 6 to slide off substrate 1, the former may be removed from the latter by acid etching under low heat (e.g., at a temperature of from about 30° C. to about 100° C).

According to a further aspect of the invention, during formation of metal nitride layer 6, silicon is automatically incorporated therein due to diffusion from silicon substrate 1. This results in a heavily n-doped metal nitride layer 6 (e.g., in the form of a GaN film), which is useful for numerous technological applications requiring a conducting (native) substrate.

After layer 6 has been completely removed from the non-native substrate 1, layer 6 may be inverted, to reveal inverse surface 6'. Inverse surface 6' is of high quality, having a very smooth surface and provides for a native metal nitride substrate surface to grow and deposit subsequent metal nitride layers. Layer 6 may be inverted and reintroduced into the same HVPE reactor, or into a second HVPE reactor, for the deposition of a high-quality epitaxial metal nitride layer 7 (FIG. 1D) on inverse surface 6' of layer 6.

Fig. 1D represents the epitaxial metal nitride layer 7 formed on inverse surface 6' of nitride layer 6 formed during the second nitride deposition, following detachment of layer 6 from substrate 1, and inversion of layer 6 to reveal inverse surface 6'. Layer 7 may be deposited to any desired thickness, e.g. in the range of about 50 to about 500 microns. According to a currently preferred embodiment of the invention, layer 7 are both composed of GaN. Silicon doping of the layers 6 and 7 is achieved by the intentional introduction of a silicon gas source, such as $SiH_4$, during the deposition and growth of layer 7. Layers 6 and 7 preferably have a combined thickness in the range of about 100 to about 500 microns.

It should be noted that the instant invention may be practiced in conjunction with conventional HVPE systems without any special adaptation. As an additional advantage of the invention, liquid layer 4 allows silicon substrate 1 and layer 6 (GaN) to contract separately as they cool, so that no stress builds up in metal nitride layer 6 and cracks do not form therein.

Figure 3:
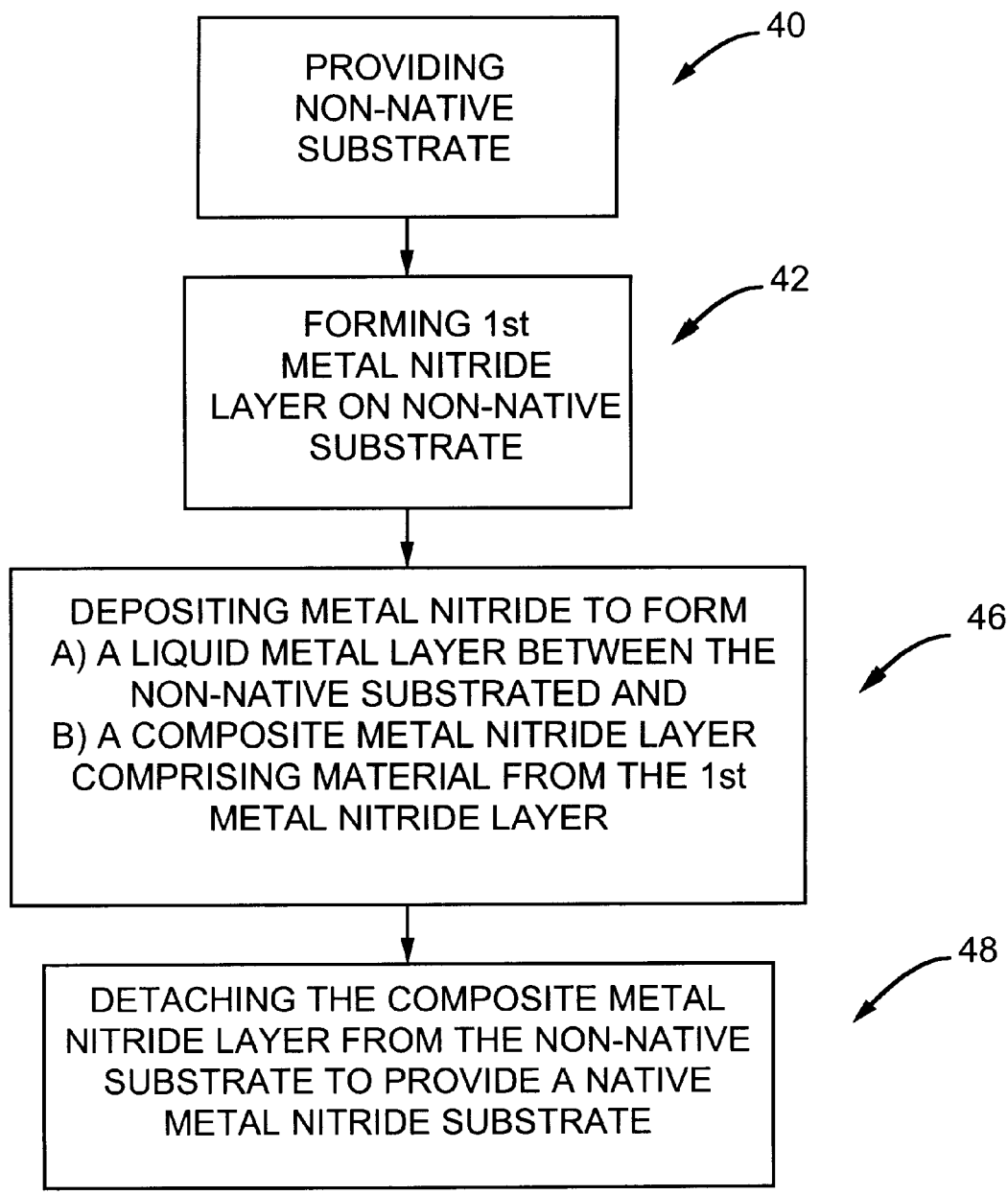
FIG. 3 schematically represents a series of steps involved in a method of making a metal nitride film, according to another embodiment of the invention.

FIG. 3 schematically represents a series of steps involved in a method of making a metal nitride film, according to another embodiment of the invention, in which step 40 involves providing a non-native substrate, most preferably a silicon substrate. Step 42 involves forming a first metal nitride layer on the non-native substrate. The first metal nitride layer is preferably a layer of a group III nitride semiconductor. More preferably the first metal nitride layer is a layer of GaN, InN, or AlN. The first layer may also be a binary or ternary alloy nitride of $Al_{1-x-y}Ga_xIn_yN$ (0x,y,1) The first metal nitride layer may be deposited by any appropriate deposition technique, such as MOCVD. As noted a potential consequence of step 42 maybe the formation of a thin layer of silicon nitride disposed on the non-native substrate beneath the first metal nitride layer. However, as previously mentioned, by judicious choice of the initial growth conditions or composition of reactants the formation of a $Si_3N_4$ layer may be avoided or eliminated and the resultant first nitride layer tends to be crystalline.

Step 46 involves forming a liquid layer on the non-native substrate concurrently during a second deposition of metal nitride by HVPE. Formation of the liquid layer results from reaction of GaCl with the non-native substrate during the second deposition of metal nitride by HVPE (step 46). The exact physical and chemical evolution of the first metal nitride layer during the process is not completely understood, but it is believed that nitride material from the first nitride deposition layer becomes incorporated into the second metal nitride layer as GaCl migrates to the interface of the non-native substrate and GaN where it forms Ga metal. The resultant nitride layer is detachable and is, henceforth, also referred to a composite nitride layer or a native GaN substrate. As alluded to hereinabove, the liquid layer is formed as a result of a single step 46, namely a second deposition of metal nitride metal nitride layer HVPE deposition in the presence of HCl. The second metal nitride layer includes an inverse surface formed adjacent to the liquid layer.

Step 48 involves detaching the metal nitride layer formed during the second nitride deposition step from the non-native substrate. Inversion of the composite metal nitride layer presents the inverse surface of the combined first and second metal nitride layer. The inverse surface of the composite metal nitride layer is of a high quality, making it suitable as a native substrate for subsequent deposition and growth of an epitaxial metal nitride layer thereon. The composite metal nitride layer may be detached from the non-native substrate by mechanical means, such as by sliding it off the non-native substrate, or by a chemical means, such as performing a low temperature acid etch. As an added advantage of the instant invention, the composite metal nitride layer formed in step 46 is automatically n-doped as a result of diffusion of Si from the silicon (non-native) substrate.

Figure 4:
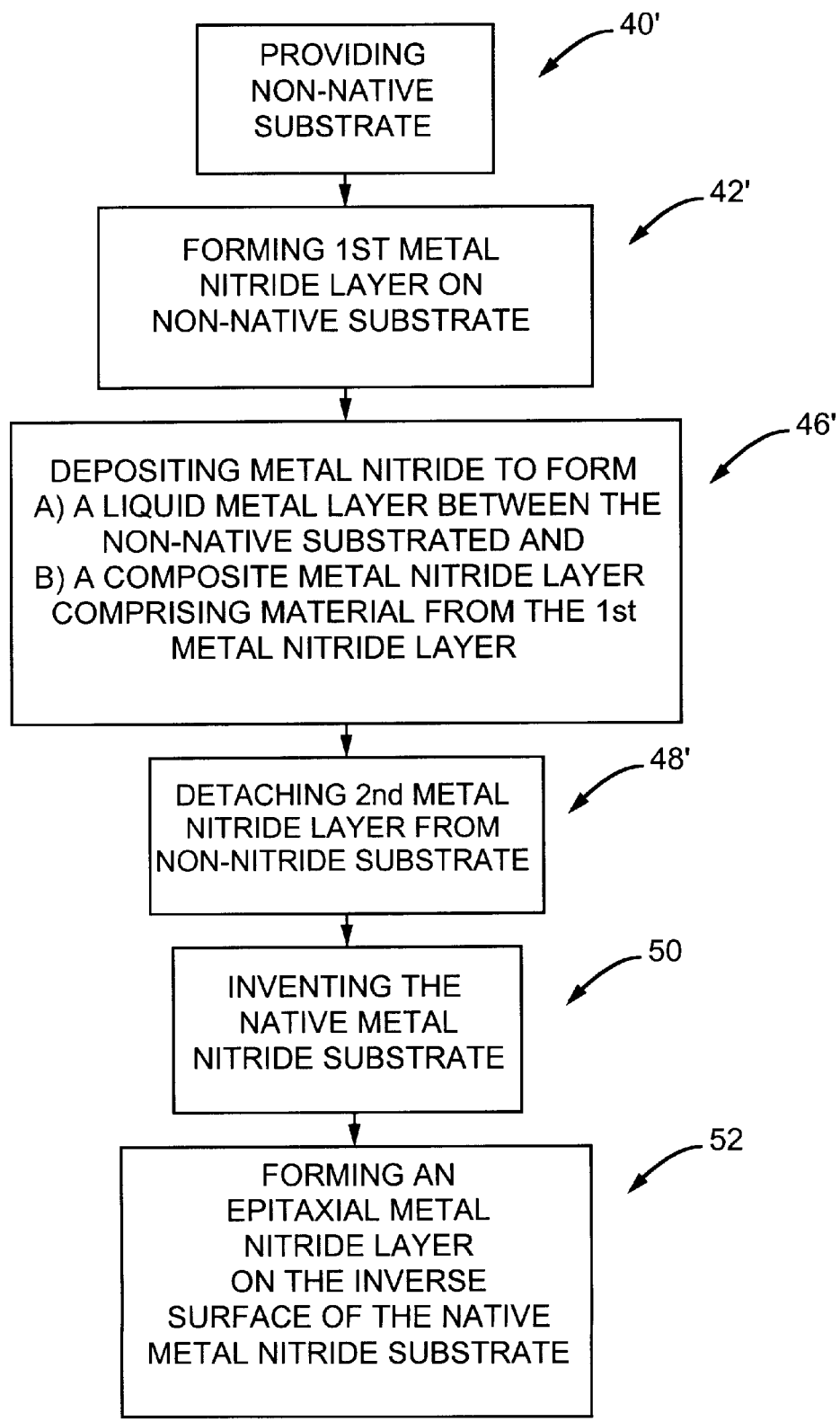
FIG. 4 schematically represents a series of steps involved in a method of forming a metal nitride substrate, according to another embodiment of the invention.

FIG. 4 schematically represents a series of steps involved in a method of forming a metal nitride substrate, according to another embodiment of the invention, in which steps 40' through 48' are analogous to steps 40 through 48 described hereinabove with reference to FIG. 3. Thus, step 48' involves detaching the composite metal nitride layer from the non-native substrate to reveal a high quality, inverse surface of the composite metal nitride layer. After step 48', step 50 involves inverting the composite metal nitride layer. By inverting the composite metal nitride layer, the inverse surface of the composite metal nitride layer is thus presented for subsequent deposition thereon (e.g., step 52).

Step 52 involves a epitaxial deposition step, wherein an epitaxial metal nitride layer is deposited on the inverse surface of the native nitride substrate layer. The epitaxial metal nitride layer, e.g., GaN, may be formed by the same HVPE process, and using the same HVPE system and reactor, as was used for deposition of the second metal nitride layer. The epitaxial metal nitride layer may be deposited to any desired thickness. Steps 40' through 52 having been duly completed, there is provided a high quality native substrate of, e.g., GaN, which is suited for many applications in fabrication of semiconductor devices, and other electronic and optoelectronic devices.

Figure 5:
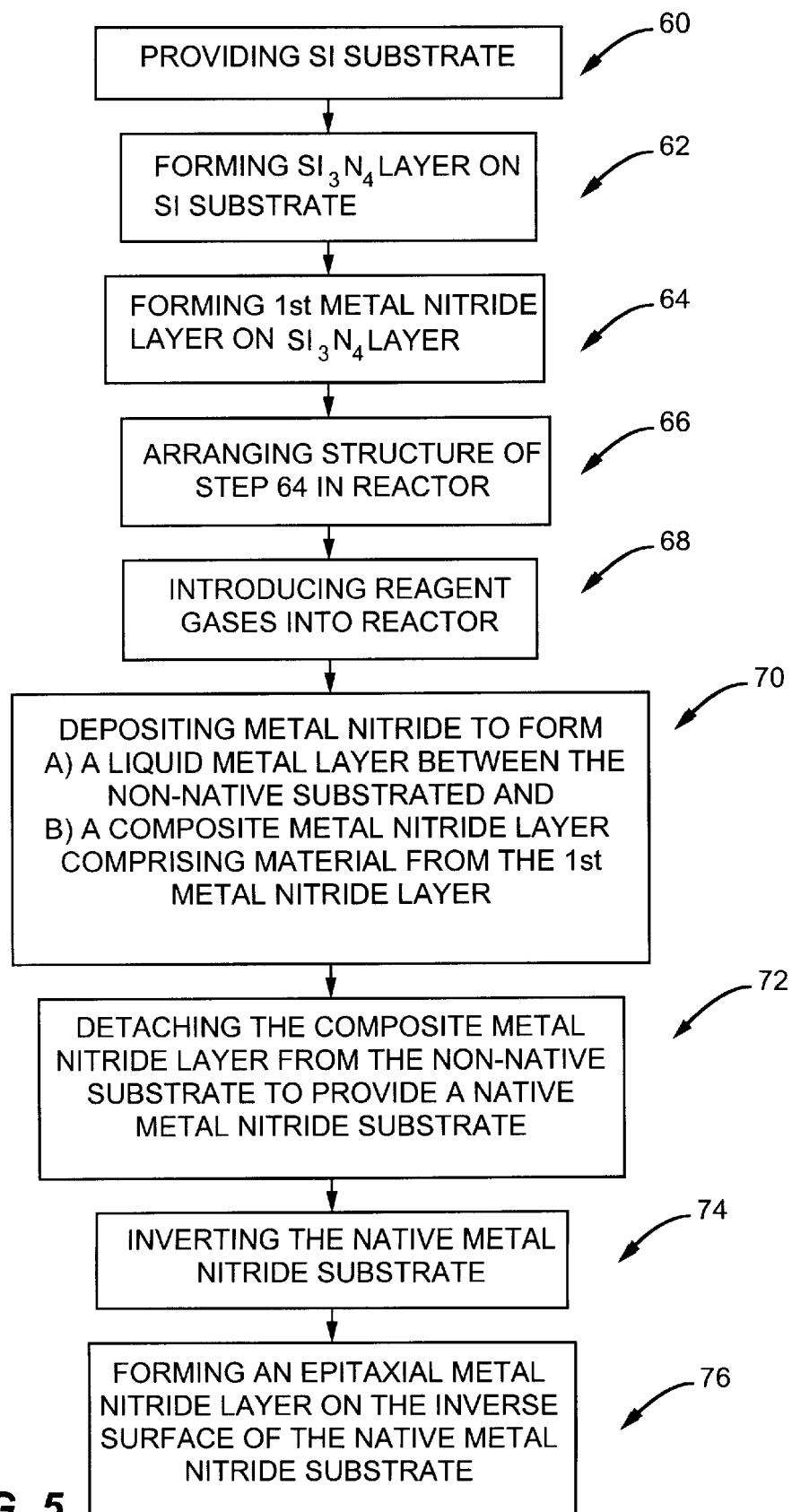
FIG. 5 schematically represents a series of steps involved in a method of growing a metal nitride epitaxial layer on a native substrate, according to another embodiment of the invention.

FIG. 5 schematically represents a series of steps involved in a method of growing an epitaxial metal nitride layer on a native substrate, according to another embodiment of the invention, in which step 60 involves providing a silicon (non-native) substrate. Step 62 involves forming a thin nitridized layer of silicon nitride on the silicon substrate. The silicon nitride layer is formed during the deposition of the first metal nitride layer (step 64). Under certain conditions, formation of the silicon nitride layer may be avoided. It should also be noted that the silicon nitride may not form a continues layer but may partially cover the surface of the silicon substrate. Step 64 includes forming the first metal nitride layer on the silicon nitride layer. The first metal nitride layer may be formed by any suitable deposition technique, such as MOCVD. Step 66 involves arranging the structure formed in step 64 in a reactor, e.g., a reactor of a HVPE system (FIG. 2).

Step 68 involves introducing reagent gases into the reactor. The reagent gases may include, e.g., GaCl and ammonia. HCl source gas is also introduced into the reactor. Step 70 involves forming a liquid layer on the silicon substrate. The liquid layer is formed as a result of reaction GaCl with the non-native substrate. The liquid layer is formed during HVPE deposition (step 70), on the structure formed in step 64, in the presence of GaCl. Step 70 involves forming, by HVPE, a composite metal nitride layer on the substrate, wherein the liquid layer is disposed between the non-native substrate and the metal nitride layer.

Step 72 involves detaching the metal nitride layer from the non-native substrate, according to techniques already described, to reveal an inverse surface of the second metal nitride layer. Step 74 involves inverting the composite metal nitride layer to present its inverse surface for subsequent deposition (step 76). Step 76 involves depositing an epitaxial metal nitride layer on the inverse surface of the composite metal nitride layer. Step 76 may be performed, for example, using the same HVPE system as in step 70. It can be seen from the above description that a number of steps can be performed using a single HVPE reactor, to provide a simple, low-cost process for producing high quality native GaN substrates. Further the epitaxial metal nitride layer deposited in step 76 may be intentionally doped by introducing dopant gases during the deposition of the nitride layer. For example, the inclusion of Si source gas, including of $SH_4$, $SiHCl_3$, $SiH_2Cl_2$, $SiH_3Cl$, $SiCl_4$ and $Si_2H_2$, during the deposition of the epitaxial metal nitride layer will result in an n-doped GaN layer.

The invention has been described primarily with respect to a particular realization of the HVPE growth of GaN. However, various growth techniques can be incorporated into the process of the instant invention. For example, any HVPE system can be used to grow and detach the GaN layers. Furthermore, the method could be adapted to incorporate growth of different, but related materials. Further while the formation of a liquid metal layer between the non-native substrate and the metal nitride provide allows the metal nitride to be removed mechanically, the non-native substrate may also be removed by etching, for example with acids, by well described in the prior art.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A method of making a metal nitride film in a reactor, comprising the steps of:
   a) providing a non-native substrate;
   b) performing a first deposition of metal nitride to form a first metal nitride layer on said substrate;
   c) performing a second deposition of metal nitride to form a composite nitride layer comprising nitride material of said first nitride layer and concurrently forming a liquid metal layer juxtaposed between said composite layer formed and said substrate.

2. The method of claim 1, wherein said step a) comprises providing a silicon substrate.

3. The method of claim 2, wherein said silicon substrate is a silicon substrate comprising a layer of silicon nitride.

4. The method of claim 1, wherein said composite metal nitride layer comprises at least one n-doped group III nitride.

5. The method of claim 1, wherein said composite metal nitride layer is a group III metal nitride comprising at least one element selected from the group consisting of Ga, In and Al.

6. The method of claim 1, wherein said step b) is performed by MOCVD.

7. The method of claim 1, wherein said step c) is performed by HVPE.

8. The method of claim 1, wherein said liquid metal layer comprises a liquid metal, selected from the group consisting of gallium, indium, and aluminum.

9. The method of claim 1, wherein said liquid metal layer remains liquid at about room temperature.

10. The method of claim 1, further comprising a step d) of removing said composite nitride layer form said substrate to provide a native metal nitride substrate.

11. The method of claim 10, wherein said composite nitride layer is removed by acid etching.

12. The method of claim 1, wherein said second metal nitride layer includes an inverse surface adjacent to said liquid metal layer, and said step d) comprises revealing said inverse surface.

13. A method of forming a metal nitride substrate in a reactor, comprising the steps of:
   a) providing a non-native substrate;
   b) performing a first deposition of metal nitride to form a first metal nitride layer on said substrate;
   c) performing a second deposition of metal nitride to form a composite nitride layer comprising nitride material of said first nitride layer and concurrently forming a liquid metal layer juxtaposed between said composite layer and said substrate;
   d) detaching said composite nitride layer from said non-native substrate to provide a native metal nitride substrate; and
   e) depositing an epitaxial metal nitride layer said native metal nitride substrate.

14. The method of claim 13, wherein said epitaxial nitride layer is intentionally n-doped by inclusion of a n-dopant gas during deposition of said epitaxial nitride layer.

15. The method of claim 14, wherein said n-dopant gas silicon source gas selected form the group consisting of $SH_4$, $SiHCl_3$, $SiH_2Cl_2$, $SiH_3Cl$, $SiCl_4$ and $Si_2H_2$.

16. The method of claim 13, wherein composite nitride layer includes an inverse surface, and said method further comprises the step of inverting said native metal nitride substrate prior to depositing said epitaxial metal nitride layer.

17. The method of claim 16, wherein said step d) comprises forming said epitaxial metal nitride layer on said inverse surface of said composite nitride layer.

18. The method of claim 13, wherein step c) is performed in the presence of a reagent gases and HCl and said rector is configured for HVPE.

19. The method of claim 13, wherein said non-native substrate comprises silicon, and said liquid metal layer comprises a liquid metal selected from the group consisting of gallium, indium, and aluminum.

20. The method of claim 13, wherein said first metal nitride layer, said composite nitride layer, and said epitaxial metal nitride layer comprise a material selected from the group consisting of gallium nitride, indium nitride, and aluminum nitride.

21. The method of claim 13, wherein said epitaxial metal nitride layer comprises a high quality GaN substrate, having a thickness in the range of from about 10 to 500 microns.

22. The method of claim 13, wherein said non-native substrate is a silicon substrate, and said step b) comprises forming a layer of silicon nitride on said non-native substrate, wherein said first metal nitride layer is formed on said silicon nitride layer.

23. The method of claim 13, wherein said steps b) and c) are performed in presence of reagent gases including HCl.

24. The method of claim 23, wherein said first nitride layer formed in said step b) is arranged in said reactor, and said reagent gases are introduced into said reactor.

25. The method of claim 24, wherein said reagent gases include ammonia and at least one reagent gas selected from the group consisting of a chloride of gallium, a chloride indium, and a chloride aluminum.

26. The method of claim 25, wherein said step c) includes the formation of GaCl that reacts with said substrate to from Ga metal at an interface of said first nitride layer and said silicon substrate.

27. The method of claim 13, wherein step d) comprises acid etching said non-native at a temperature in the range of from about 30 to 100° C. to provide said native metal nitride substrate.

28. The method of claim 13, wherein said steps b) and c) are performed in the same said reactor.

29. The method of claim 13, wherein said non-native substrate is a silicon substrate, and said composite nitride layer is automatically doped with silicon, prior to said step d).

30. The method of claim 13, wherein said epitaxial metal nitride layer is a group III nitride comprising at east one element selected form the group selected from Ga, Al and In.

31. A native metal nitride substrate adapted for metal nitride epitaxial deposition, comprising: a metal nitride layer formed by HVPE comprising an inverse surface, and said inverse surface formed adjacent to a liquid metal layer.

32. The native metal nitride substrate of claim 31, further comprising an epitaxial metal nitride layer disposed on said inverse surface of said native metal nitride substrate to form a nitride structure.

33. The native metal nitride substrate of claim 31, wherein said native metal nitride substrate is formed on a silicon substrate, and said native metal nitride substrate is heavily doped with silicon, said silicon derived by diffusion from said silicon substrate.

34. The nitride structure of claim 33, wherein said native metal nitride substrate is formed on a silicon substrate, and said native metal nitride substrate is detached from said silicon substrate.

35. The nitride structure of claim 32, wherein said native metal nitride substrate and said epitaxial metal nitride layer comprise a material selected from the group consisting of gallium nitride, indium nitride, and aluminum nitride.

36. The nitride structure 32, wherein said epitaxial metal nitride layer is formed by HVPE.

37. The nitride structure 32, wherein said substrate and said epitaxial nitride layer are formed in the same said reactor.

38. The nitride structure 32, wherein said native metal nitride substrate has a thickness in the range of from 10 to 500 microns and said epitaxial nitride layer has a thickness in the range of from about 10 to 500 microns.

39. The native metal nitride substrate of claim 31, wherein said liquid metal layer comprises liquid gallium, liquid indium, or liquid aluminum.

40. The native metal nitride substrate of claim 31, wherein said liquid metal layer is formed by reaction of a silicon with GaCl during HVPE.

* * * * *

UNITED STATES PATENT AND TRADEMARK OFFICE
CERTIFICATE OF CORRECTION

PATENT NO. : 6,176,925 B1
DATED : January 23, 2001
INVENTOR(S) : Solomon et al.

It is certified that error appears in the above-identified patent and that said Letters Patent is hereby corrected as shown below:

The tite page showing the illustrative figure should be deleted to be replaced with the attached title page.

Signed and Sealed this

Twenty-fourth Day of August, 2004

JON W. DUDAS
*Director of the United States Patent and Trademark Office*

United States Patent
Solomon et al.

(10) Patent No.: US 6,176,925 B1
(45) Date of Patent: Jan. 23, 2001

(54) DETACHED AND INVERTED EPITAXIAL REGROWTH & METHODS

(75) Inventors: Glenn S. Solomon, Redwood City; David J. Miller, Belmont; Tetsuzo Ueda, Menlo Park, all of CA (US)

(73) Assignees: CBL Technologies, Inc., Redwood City, CA (US); Matsushita Electronics Corporation, Osaka (JP)

(*) Notice: Under 35 U.S.C. 154(b), the term of this patent shall be extended for 0 days.

(21) Appl. No.: 09/307,154

(22) Filed: May 7, 1999

(51) Int. Cl.$^7$ .................................................. C30B 25/02
(52) U.S. Cl. .......................... 117/89; 117/95; 117/101; 117/102; 117/915; 117/952
(58) Field of Search ........................ 117/915, 89, 95, 117/101, 102, 952

(56) References Cited

U.S. PATENT DOCUMENTS

| | | | |
|---|---|---|---|
| 5,889,338 | * 11/1999 | De Boer et al. | 117/84 |
| 6,030,886 | * 2/2000 | Yuri et al. | 117/952 |
| 6,045,626 | * 4/2000 | Yano et al. | 117/952 |
| 6,096,130 | * 8/2000 | Kimura et al. | 117/101 |

FOREIGN PATENT DOCUMENTS

WO9814986 * 4/1998 (WO)

OTHER PUBLICATIONS

Woong et al, "Damage-Free Separation of GaN Thin Films from Substrates" Applied Physics Letters, vol. 72(5) pp. 599–601, 1998.*

* cited by examiner

Primary Examiner—Robert Kunemund
(74) Attorney, Agent, or Firm—Lumen Intellectual Property Services

(57) ABSTRACT

An n-doped, high quality gallium nitride substrate suitable for further device or epitaxial processing, and method for making the same. The nitride substrate is produced by epitaxial deposition of first metal nitride layer on a non-native substrate followed by a second deposition of metal nitride. During the second deposition of metal nitride, a liquid metal layer is formed at the interface of the non-native substrate and the metal nitride layer form. The formed metal nitride layer may be detached from the non-native substrate to provide an metal nitride substrate with a high quality inverse surface. A epitaxial metal nitride layer may be deposited on the inverse surface of metal nitride substrate. The metal nitride substrate and the epitaxial metal nitride layer thereon may be deposited using the same hydride vapor-phase epitaxy system.

40 Claims, 5 Drawing Sheets

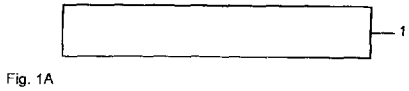
Fig. 1A

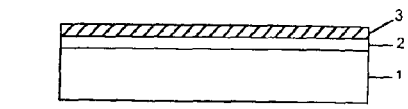
Fig. 1B

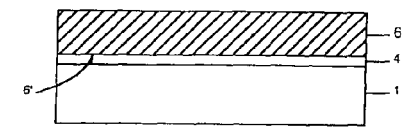
Fig. 1C

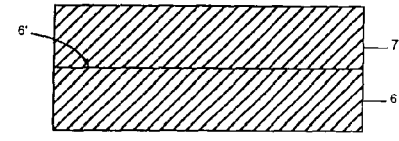
Fig. 1D